United States Patent [19]
Kitamura et al.

[11] Patent Number: 5,483,090
[45] Date of Patent: Jan. 9, 1996

[54] SOLID-STATE IMAGE PICKUP DEVICE AND METHOD FOR MANUFACTURING SUCH DEVICE

[75] Inventors: Isaya Kitamura, Anpachi; Yoshiki Nakamura, Chita; Masakazu Inami, Motosu; Yoshihiro Okada, Hashima, all of Japan

[73] Assignee: Sanyo Electric Co., Ltd., Osaka, Japan

[21] Appl. No.: 225,004

[22] Filed: Apr. 7, 1994

[30] Foreign Application Priority Data

| Apr. 9, 1993 | [JP] | Japan | 5-083343 |
| Apr. 9, 1993 | [JP] | Japan | 5-083344 |
| Apr. 9, 1993 | [JP] | Japan | 5-083346 |
| Apr. 14, 1993 | [JP] | Japan | 5-087372 |
| Feb. 28, 1994 | [JP] | Japan | 6-030324 |

[51] Int. Cl.⁶ .................. H01L 27/148; H01L 29/768
[52] U.S. Cl. .......... 257/231; 257/223; 257/250; 257/412
[58] Field of Search ..................... 257/222, 223, 257/231, 249, 250

[56] References Cited

U.S. PATENT DOCUMENTS

| 4,481,538 | 11/1984 | Battson et al. | 257/250 |
| 4,658,278 | 4/1987 | Elabo et al. | 257/249 |
| 4,695,860 | 9/1987 | Blanchard et al. | 257/249 |

*Primary Examiner*—Gene M. Munson
*Attorney, Agent, or Firm*—Loeb and Loeb

[57] ABSTRACT

A plurality of channel separting regions are formed on a substrate with a space therebetween to segment an channel region. A first insulating layer is formed on the substrate, and a polycrystalline silicon layer is formed thereon and is then subject to patterning so as to provide a plurality of first transfer electrodes in the direction crossing the channel separating region. A second insulating layer is formed on the first transfer electrode and on the substrate having been exposed by the patterning, and a second transfer electrodes are formed at a position between the first transfer electrodes on the second insulating layer. By setting the thickness of each transfer electrodes and the each insulating layer to a predetermined value, the interference of the visible light is controlled, and the transparency rate of the visible light is improved. Further, by increasing the thickness of the transfer electrode at regions other than the light-receiving region, the contact with the electrode is improved, and the operation at regions other than the light-receiving region is improved.

8 Claims, 14 Drawing Sheets

SOLID-STATE IMAGE PICKUP DEVICE AND METHOD FOR MANUFACTURING SUCH DEVICE

BACKGROUND OF THE INVENTION

1. Field of the Invention

The present invention relates to a solid-state image pickup device and method for manufacturing a solid-state image pickup device having imaging region which is covered with transfer electrodes.

2. Description of the Prior Art

In a frame transfer-type CCD solid-state image pickup device, a image pickup section for receiving light from an object acts to accumulate information charges generated in response to the illuminated light and simultaneously transfers the information charges having been accumulated for a predetermined time period to an accumulating section. Therefore, transfer electrode is provided on the light-receiving region to transfer the information charges.

FIG. 1 is a plan view showing outline of a frame transfer-type CCD solid-state image pickup device.

A image pickup section is composed of a plurality of CCD shift registers arranged in series in the vertical direction. The shift registers accumulate the information charges generated in accordance with the input light amount in each bit during the light-receiving period, and then transfers the information charges in accordance with the vertical transfer clock $\phi V$ during the transfer period. An accumulating section 102 is composed of a CCD shift register arranged in series with the shift registers of the image pickup section 101, and receives the information charges output from the image pickup section 101 during the transfer period to accumulate them in response to the accumulating transfer clocks $\phi S$. A horizontal transfer section 103 is composed of a row (or more) of CCD shift registers arranged in series in the horizontal direction, and receives at its each bit the output from the shift register of the accumulating section 102, and outputs the information charges with a horizontal line unit in accordance with the horizontal transfer clock $\phi H$. An output section 104 comprises a floating diffusion (electrically independent diffusion region) for converting the charge amount into the voltage amount and an amplifier for picking up a potential fluctuation of the floating diffusion so that the information charges output in one bit unit from the horizontal transfer section 104 into voltage value and output them as image signals. As shown in FIG. 2, for example, the output section 104 is composed of a floating diffusion 110 for receiving CCD output of the horizontal transfer section 103, a transistor 111 for resetting the potential of the floating diffusion 110 in accordance with the reset clock $\phi R$, and a pair of transistors 112 and 113 which form the amplifier by being coupled to a source follower, so as to output image signals in response to the change of the charge amount of the information charges output from the horizontal transfer section 3.

FIG. 3 is a plan view showing a structure of the image pickup section 101 of the solid-state image pickup device, while FIG. 4 is a cross-sectional view cut out by the line IV—IV in FIG. 3, and FIG. 5 is a cross-sectional view cut out by the line V—V in FIG. 3.

At the light receiving region at a surface of the P-type silicon substrate 120, a plurality of channel separating regions 121 containing P-type impurities of high density therein are arranged in parallel to each other. In the same manner, also in the marginal region, a separating region 122 containing P-type impurities of high density is formed as to surround the light-receiving region. A channel region 123 between the channel separating regions 121 forms a buried channel structure by N-type impurities being diffused at the surface portion of the substrate. A plurality of transfer electrodes 125 of the first layer made of polycrystalline silicon are arranged to extend until the marginal region crossing the light-receiving region in the direction to cross the channel region 123, via an insulating layer 124 on the silicon substrate 120 having the channel separating region 121 and the channel region 123 formed thereon. On these first transfer electrodes 125, there are also provided transfer electrodes 126 of the second layer made of polycrystalline silicon to cover the gap of the first transfer electrodes 125, thereby forming two-layered structure.

During the accumulating period, a fixed potential is applied to the transfer electrodes 125 and 126 respectively such that information charges are accumulated in the light-receiving pixels formed with four transfer electrodes 125 and 126 as a unit. Further, after termination of a predetermined light-receiving period, clock pulses, for example of four phases, are applied to the transfer electrodes 125 and 126, and the information charges accumulated in each pixel are transferred to the accumulating section side along the channel region 123.

An aluminum power supply lines 128 are arranged on the transfer electrodes 125 and 126 at the marginal region via the insulating layer 127 and coupled to the transfer electrodes 125 and 126 through contact holes 129 formed in the insulating layer 127. The power supply lines 128 are provided to correspond to the number of phases of the transfer clocks supplied to the transfer electrodes 125 and 126. In the case of four-phases clock, four lines are provided, each four lines of which are regularly connected to the transfer electrodes 125 and 126.

The image pickup section of the aforementioned CCD solid-state image pickup device obtains information charges by the opto-electric effect of the incident light on the channel region 123. Therefore, there has been considered to enhance the light projecting efficiency by, for example, providing an opening in the transfer electrodes 125 and 126 and reducing the film thickness of the transfer electrodes 125 and 126. In particular, if each section is refined (micronized) to correspond to the tendency of providing higher and higher resolution, the area of the light-receiving pixel would be reduced to cause lowering of light-receiving sensitivity. To cope with this problem, the light projecting efficiency must be improved. However, if an opening is formed in the transfer electrodes 125 and 126, the shape of the electrodes would become complicated so as to make the micronizing process difficult. Therefore, this method would not be apt to the trend of higher resolution. Meanwhile, in the case of reducing the thickness of the transfer electrodes 125 and 126, piercing of the connecting portion near the marginal region of the image pickup section between power supply lines 128 and insulating layer 127 would easily arise, which would significantly reduce the reliability of the device. In addition, since the electrodes at the other regions (accumulating section and output section) which are formed by the same processes as those of the transfer electrodes 125 and 126 would become to have the same thinner thickness, there would arise lowering of the transfer efficiency of the accumulating section and horizontal transfer section, and the reduction of the characteristics of the output section.

Moreover, if the film thickness of the transfer electrodes 125 and 126 is reduced, the side marginal portion of the transfer electrode 125 of the first layer would easily float when an interlayer insulating layer for insulating the transfer electrodes of the first layer 125 from that of the second layer 126 is formed. Namely, since the interlayer insulating layer is formed by the thermal oxidation of the surface of the transfer electrode 125 formed of polycrystalline silicon, the oxide layer between the silicon substrate 120 and the transfer electrode 125 would start growing from the lateral side of the transfer electrode 125 at the time of its thermal oxidizing process, so that the side marginal portion of the transfer electrode 125 would float when the thickness of the transfer electrode 125 is thin. If such floating of the side marginal portion of the transfer electrode 125 arises, this floated portion can not be sufficiently removed by an etching process to be executed thereafter, which would cause leakage of electric current. Moreover, the effective gate length of the transfer electrode 125 would be reduced so as not to be able to provide desired characteristics, and projections would arise at the floated portion of the transfer electrodes 125 and 126, causing transfer insufficiency by the concentration of electric field at the projections.

SUMMARY OF THE INVENTION

It is therefore an object of this invention to improve the light incident efficiency i.e. the light-receiving sensitivity by setting the thickness of the transfer electrode to a predetermined value.

It is another object of this invention to improve the light incident efficiency on the pickup section while preventing the reliability of the elements and the characteristics of each section from lowering.

It is another object of this invention to prevent the transfer electrodes of the first layer of the multi-layered structure (first transfer electrodes) from floating.

It is another object of this invention to improve the light incident efficiency by reducing the thickness of the transfer electrode at the light-receiving region thinner than that at the marginal region.

It is another object of this invention to efficiently manufacturing transfer electrodes having thickness being thinner at the marginal region than at the light-receiving region.

According to this invention, a solid-state image pickup device for accumulating information charges, generated in response to light incident on a semiconductor substrate, in a potential well formed in a portion adjacent to a surface of the substrate by function of a plurality of transfer electrodes on the substrate, said solid-state image pickup device comprising: a semiconductor substrate on which a plurality of channel separating regions for preventing the information charges from moving are arranged in parallel to each other; a plurality of first transfer electrodes arranged in parallel to each other with a predetermined space therebetween on the semiconductor substrate and extending in the direction crossing the channel separating region; a plurality of second transfer electrodes arranged to cover the space between the first transfer electrodes; wherein the thickness of the first and the second transfer electrodes are each set to be in a range between approximately 50 nm–100 nm.

Thus, since the thickness of the first and the second transfer electrodes are set in a range of approximately 50 nm –100 nm (preferably 90–100 nm in particular), the optical interference at the visible light region would be minimized, so that the light would pass the transfer electrodes most efficiently to reach the channel region located under the transfer electrodes. As a result, the light-receiving sensitivity will be improved.

In addition to the transfer electrodes each having a thickness of approximately 50–100 nm, the present invention features that the first transfer electrodes are formed on the first insulating layer formed on the surface of the semiconductor substrate, and that the thickness of the first insulating layer is set to a value between 120 nm and 180 nm.

Therefore, the maximum value of the spectral sensitivity of the image pickup device would be within the visual light region.

Further, according to this invention, a method for manufacturing a solid-state image pickup device for accumulating information charges, generated in response to light incident on a semiconductor substrate, in a potential well formed in a portion adjacent to a surface of the substrate by function of a plurality of transfer electrodes arranged on the substrate, said method comprising steps of: forming an insulating layer on the semiconductor substrate on which a plurality of channel separating regions are formed in parallel to each other for preventing the information charges from moving; forming a plurality of first transfer electrodes with a predetermined space therebetween extending in the direction crossing the channel separating regions on the insulating layer; forming a first insulating layer by oxidizing the surface of the first transfer electrodes and the exposed surface of the semiconductor substrate; forming a second insulating layer by chemical vapor deposition the same material as the first insulating layer on the first insulating layer; and forming a plurality of second transfer electrodes to cover the space between the first transfer electrodes on the second insulating layer.

As a result, by forming the thick second insulating layer by chemical vapor deposition after forming the first insulating layer by slightly oxidizing the surface of the first transfer electrodes, the growth of the oxide layer between the first transfer electrodes and the semiconductor substrate can be suppressed so as to prevent the lateral side portion of the first transfer electrodes from floating.

Furthermore, according to this invention, a method for manufacturing a solid-state image pickup device for accumulating information charges, generated in response to light incident on a semiconductor substrate, in a potential well formed in a portion adjacent to a surface of the substrate by function of a plurality of transfer electrodes arranged on the semiconductor substrate, said method comprising steps of: forming an insulating layer on the semiconductor substrate on which a plurality of channel separating regions are arranged in parallel to each other to prevent the information charges from moving; forming a plurality of transfer electrodes arranged in parallel to each other with a predetermined space therebetween and extending in the direction crossing the channel separating region; forming a plurality of second transfer electrodes arranged to cover the space between the first transfer electrodes; wherein the thickness of the transfer electrodes is set so that the spectral sensitivity of the solid-state image pickup device indicates the maximum value at a desired wavelength and the thickness of the insulating layer under said transfer electrodes is set so that the spectral sensitivity of the solid-state image pickup device indicates desired characteristics at that thickness of the transfer electrodes.

As a result, by setting the wavelength representing the maximum value of the spectral sensitivity by controlling the thickness of each of the transfer electrodes and by setting the characteristics of the spectral sensitivity by controlling the thickness of the insulating layer under the transfer electrodes, it is possible to readily obtain desired spectral sensitivity and characteristics.

Further, according to this invention, the thickness of the transfer electrodes is set so that the spectral sensitivity of the solid-state image pickup device indicates the maximum value at a particular wavelength in the visible light region, and the thickness of the insulating layer is set so that the spectral sensitivity of the solid-state image pickup device indicates a high value at the short wavelength side in the visible light region at that thickness of the transfer electrodes.

As a result, it is possible to improve the light sensitivity at the short wavelength side and to provide a solid-state image pickup device having well-balanced spectral sensitivity characteristics.

Further, according to this invention, a solid-state image pickup device for accumulating information charges, generated in response to light incident on a semiconductor substrate, in a potential well formed in a portion adjacent to a surface of the substrate by function of a plurality of transfer electrodes arranged on the substrate, said element comprising: a semiconductor substrate on which a plurality of channel separating regions for preventing the information charges from moving are arranged in parallel to each other at least at an inner region on the surface thereof; a plurality of transfer electrodes arranged in parallel to each other with a predetermined space therebetween on the semiconductor substrate and extending in the direction crossing the channel separating regions until a marginal region surrounding the inner region; and a plurality of power supply lines arranged to overlap the end portions of the transfer electrodes at the marginal region and regularly coupled to the transfer electrodes; wherein the transfer electrodes have a thickness being thicker at the marginal region than at the inner region.

As a result, the light incident efficiency on the channel region of the image pickup section can be improved by reducing the film thickness of the transfer electrodes only at the light-receiving region of the image pickup section. Moreover, since the marginal region of the light-receiving region of the transfer electrodes have thicker thickness, the contact portion of power supply lines connected to the transfer electrodes at the marginal region would not pierce toward the substrate side. Further, since the portion of the electrode other than the image pickup section is formed to have a sufficient thickness, it is possible to avoid the lowering of the transfer efficiency of the accumulating section and the horizontal transfer section and the deterioration of the characteristics of the output section.

Further, according to this invention, a method for manufacturing a solid-state image pickup device for accumulating information charges, generated in response to light incident on a semiconductor substrate, in a potential well formed in a portion adjacent to a surface of the substrate by function of a plurality of transfer electrodes arranged on the semiconductor substrate, said method comprising steps of: forming a plurality of channel separating regions at an inner region of the surface of the semiconductor substrate in parallel to each other for preventing the information charges from moving; forming a first conductive layer at the inner region and the marginal region surrounding the inner region on the semiconductor substrate; eliminating a part of the first conductive layer corresponding to the inner region; forming a second conductive layer at the inner region and the marginal region; forming a plurality of first transfer electrodes crossing the inner region and extending until the marginal region by patterning the first and the second conductive layers in the direction crossing the channel separating regions; forming power supply lines to be coupled to the transfer electrodes at the marginal region.

As a result, it is possible to provide transfer electrodes having thickness being reduced only at the light-receiving region of the image pickup section.

Further, according to this invention, a method for manufacturing a solid-state image pickup device for accumulating information charges, generated in response to light incident on a semiconductor substrate, in a potential well formed in a portion adjacent to a surface of the substrate by function of a plurality of transfer electrodes arranged on the semiconductor substrate, said method comprising steps of: forming a plurality of channel separating regions in parallel to each other at a light-receiving region on a semiconductor substrate for preventing the information charges from moving; forming a first insulating layer on the semiconductor substrate; forming a conductive layer on the insulating layer; selectively oxidizing the surface of the conductive layer in correspondence to the light-receiving region; forming a plurality of first transfer electrodes crossing the light-receiving region in the direction crossing the channel separating regions by etching the conductive layer after removing the oxidized portion of the conductive layer; and forming power supply lines to be coupled to the transfer electrodes at the marginal region.

As a result, since the thick polycrystalline silicon film is selectively oxidized to partially reduce the thickness, the polycrystalline silicon layer can be completed by just one process. Accordingly, the processing time required to form the polycrystalline silicon layer can be shortened. Further, by reducing the thickness of the polycrystalline layer thickness by selective oxidation, the insulating layer under the polycrystalline silicon layer would not easily subject to the undesirable influence of the manufacturing processes, thereby maintaining the reliability of function.

The above and other objects, features and advantages of the present invention will become clear from the following description of the preferred embodiment thereof, taken in conjunction with the accompanying drawings.

DETAILED DESCRIPTION

First Embodiment

Figure 1:
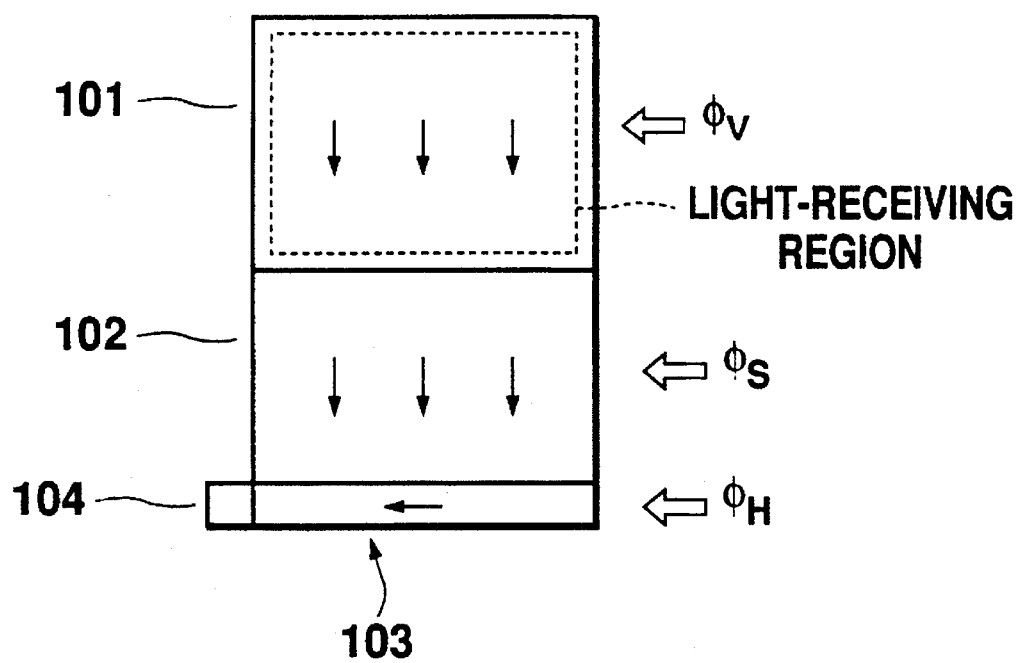
FIG. 1 is a schematic plan view of a frame transfer-type CCD solid-state pickup element.
Figure 2:
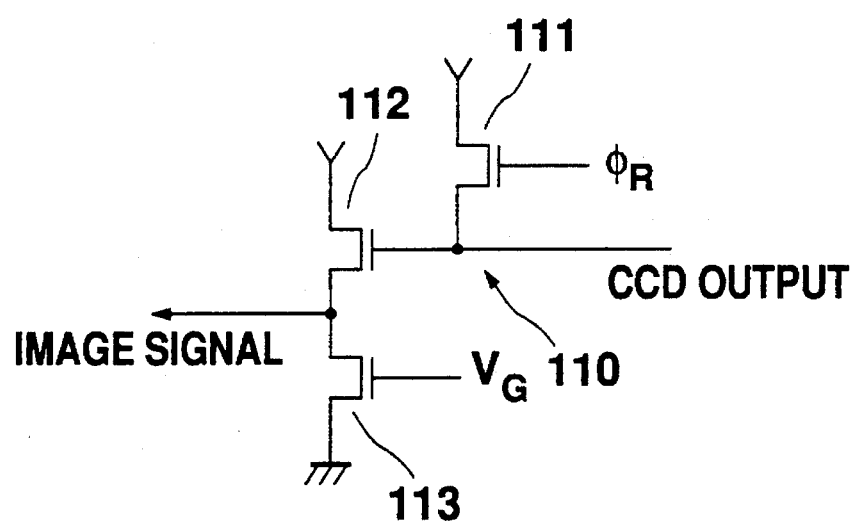
FIG. 2 is a circuit diagram of an output section of a CCD solid-state pickup element.
Figure 3:
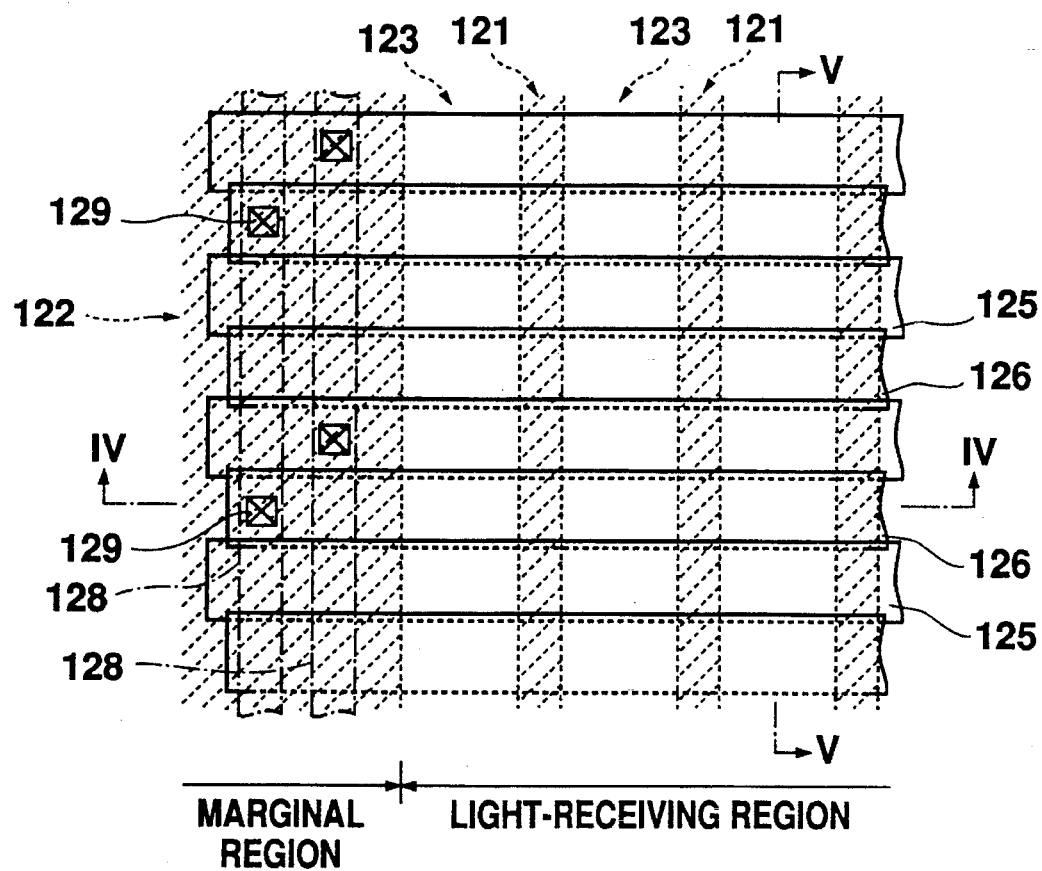
FIG. 3 is a plan view showing an pickup section of a conventional solid-state pickup element.
Figure 4:
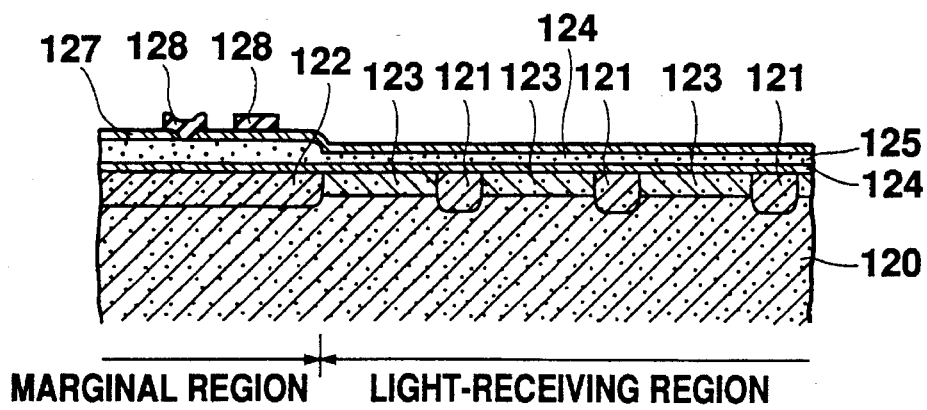
FIG. 4 is a cross-sectional view cut out via IV—IV line in FIG. 3.
Figure 5:
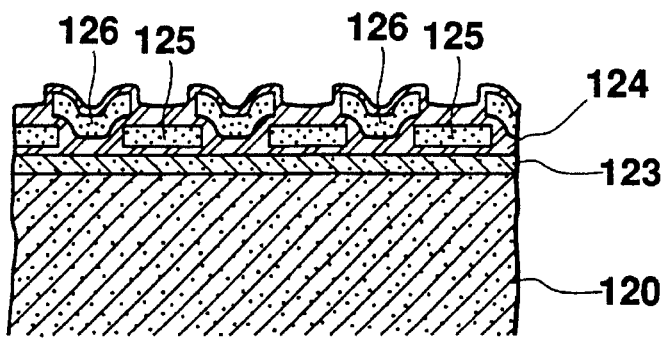
FIG. 5 is a cross-sectional view via V—V line in FIG. 3.
Figure 6:
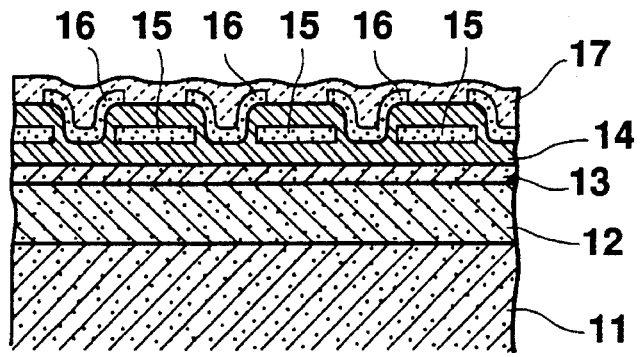
FIG. 6 is a cross-sectional view of an imaging section of a solid-sate pickup element according to a first embodiment of this invention.
Figure 7:
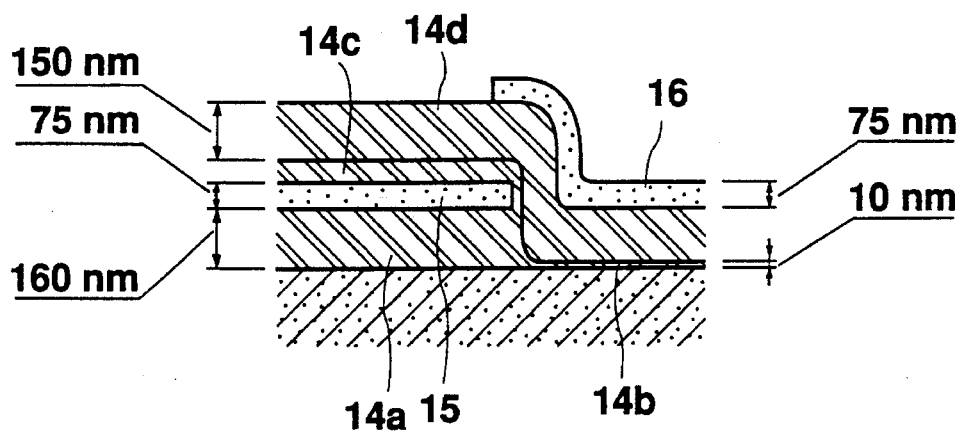
FIG. 7 is a enlarged view of a transfer electrode section of a solid-state pickup element according to a first embodiment of this invention.

FIG. 6 is a cross-sectional view showing a image pickup section of a solid-state image pickup device according to this invention, and FIG. 7 is an enlarged view of a transfer electrode portion in FIG. 6. The image pickup device shown in these FIGS. 6 and 7 is of vertical over flow drain structure in which over flow charges are absorbed at the substrate side.

At one surface of a N-type silicon substrate 11, there is formed a diffusion region 12 in which P-type impurities are diffused. A plurality of channel separating regions (not shown) made of high-density P-type region or thick oxide layer are formed in the diffusion region 12 in parallel to each other. A channel region located between the channel separating regions has a buried channel region 13 formed therein to contain diffused N-type impurities at its surface region. A plurality of first transfer electrodes 15 made of polycrystalline silicon are crossing the channel region via a silicon oxide layer 14a formed by thermal oxidation on the silicon substrate 11 with a predetermined space therebetween. In this case, the thickness of the silicon oxide layer 14a is set to approximately 160 nm, while that of the transfer electrode 15 is set to approximately 75 nm.

A plurality of second transfer electrodes 16 are arranged on those of the first transfer electrodes 15 to cover the space between the first transfer electrodes 15 via an insulating layer of two-layered structure having silicon oxide layer 14b and 14c made by thermal oxidation and silicon oxide layer 14d made by chemical vapor deposition. These transfer electrodes of the second layer are also formed of polycrystalline silicon. The thickness of the silicon oxide layer 14b formed at the space portion of the transfer electrode 15 by thermal oxidation is approximately 10 nm, that of the silicon oxide layer 14 made by chemical vapor deposition is approximately 150 nm, and that of the transfer electrode 16 is approximately 75 nm. As a result, the thickness of the silicon oxide layers 14b and 14d formed under the second transfer electrodes 16 would become equal to that of the silicon oxide layer 14a formed under the first transfer electrode 15. PSG layer 17 is formed as an insulating layer on the second transfer electrode 16, and power supply lines made of aluminum etc. to the first transfer electrodes 15 and 16 are arranged on the PSG layer 17 at the marginal region of the image pickup section.

In the solid-state image pickup device having aforementioned structure, the maximum value of the spectral sensitivity presents within the visible light region (approximately 550 nm of wavelength), and the light-receiving sensitivity at the short wavelength side i.e. blue color region (approximately 500 nm of wavelength) is excellent.

The values of the thickness indicated above are determined based on the result of simulation in which a variety of conditions are established and on the result of measurement carried out using actually manufactured solid-state image pick-up device. Next, a method for optimizing each film thickness value will now be described.

Figure 8:
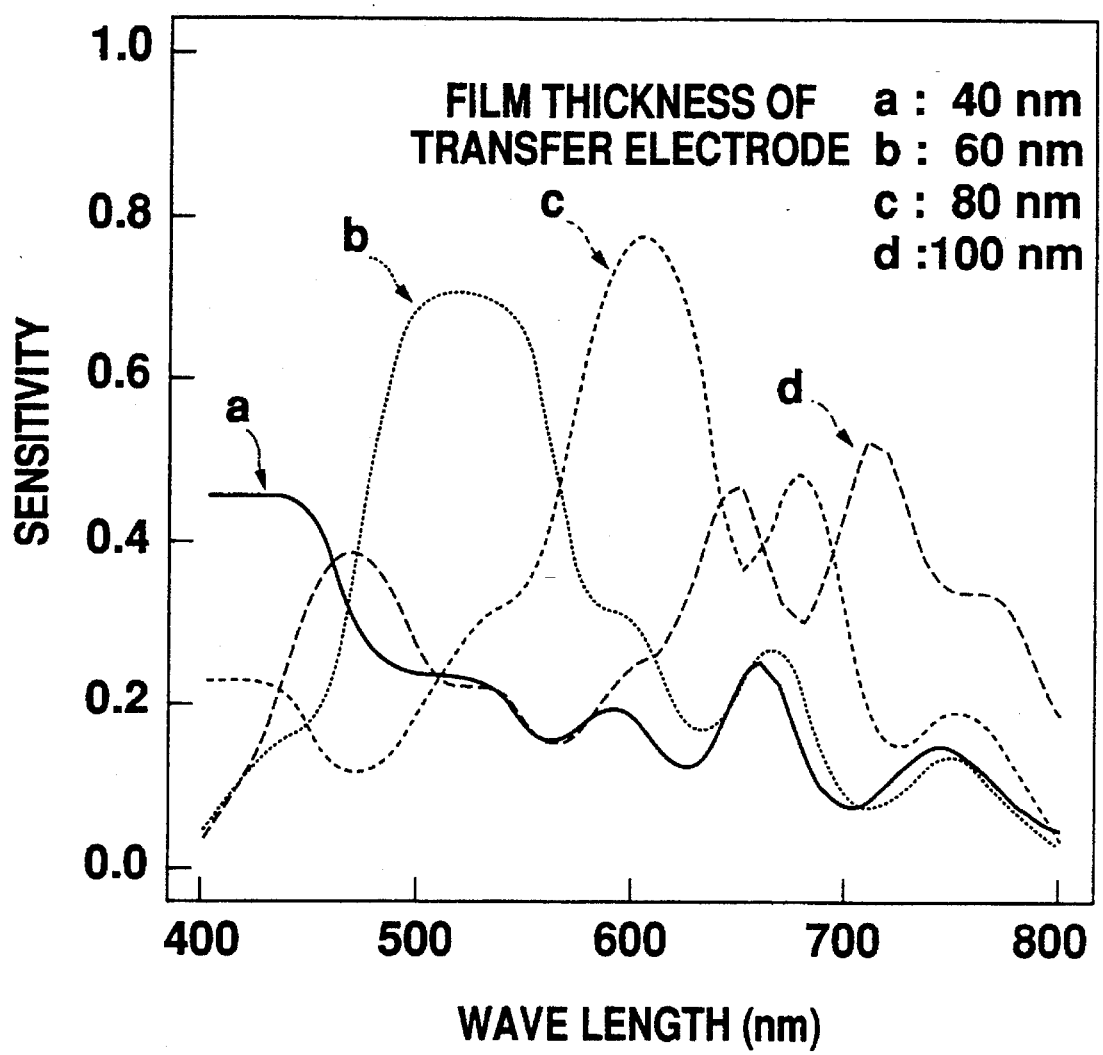
FIG. 8 shows a simulation result of a spectral sensitivity of a solid-state pickup element according to a first embodiment of this invention.

Firstly, when the thickness of the oxide layer located under the transfer electrode is set to a predetermined value (150 nm) and the thickness of the transfer electrodes are set as a: 40 nm; b: 60 nm; c: 80 nm and d: 100 nm, the spectral sensitivity characteristics of the solid-state image pickup device in each case would become as shown in FIG. 8 by simulation. In FIG. 8, the horizontal axis stands for the wavelength of the incident light, while the vertical axis stands for the relative sensitivity of the incident light. In each spectral sensitivity characteristics, except a, the wavelength of the incident light rises at an wavelength of approximately 400 nm, and resumes at approximately 800 nm. And it can be confirmed that the peak position of the spectral sensitivity tends to deviate toward the long wavelength side as the thickness of the transfer electrode increases. In reference to the spectral sensitivity of the visible light region (approximately 400 nm–800 nm), it is seen that the "b" and "c" having peak ranging from the intermediate portion of the visible light region to the short wavelength side have characteristics being almost ideal. Thus, if the peak of the absolute sensitivity exists at a range from the intermediate portion of the visible light region to the short wavelength side tending to relatively lack sensitivity, the characteristics of the spectral sensitivity would becomes well balanced between the short wavelength side and the long wavelength side.

Figure 9:
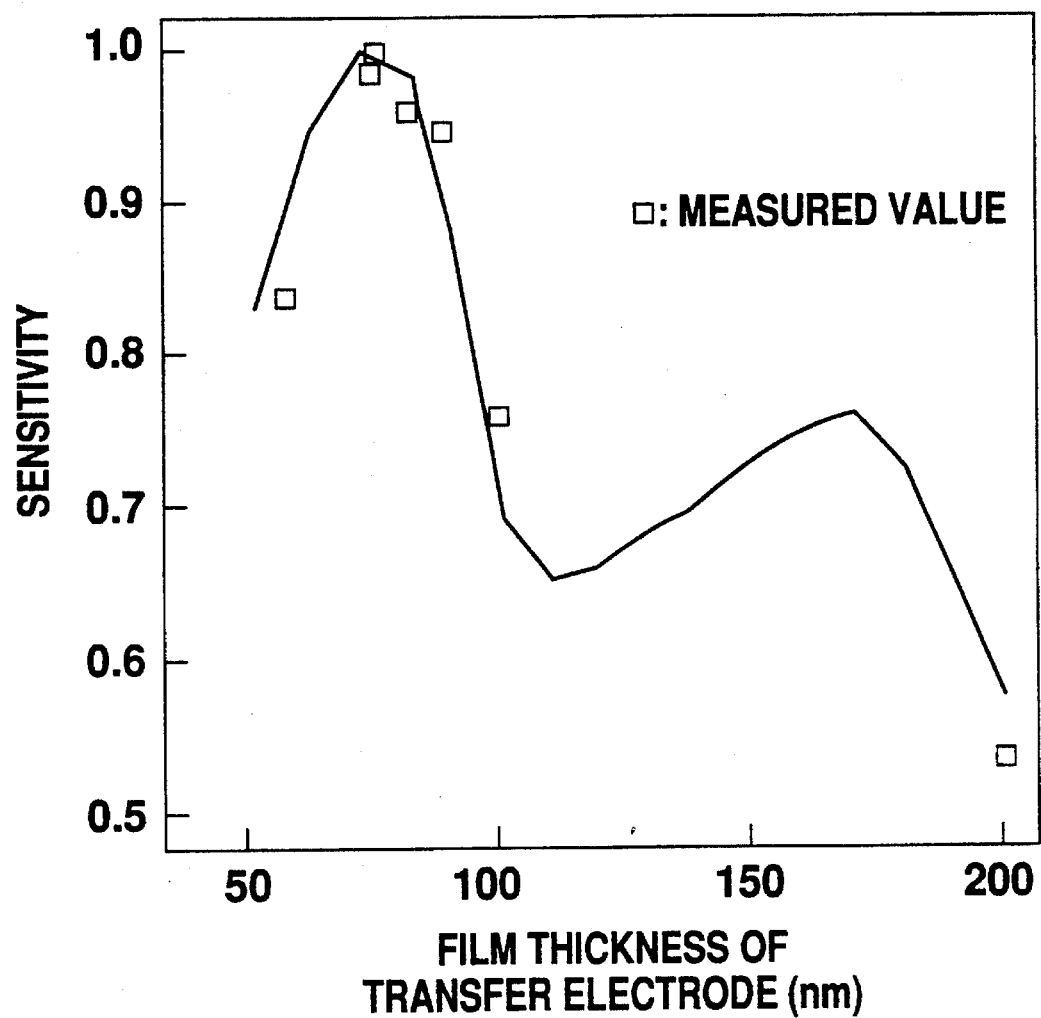
FIG. 9 is a graphic diagram showing a simulation result and measured value of relationship between the film thickness of the transfer electrode and sensitivity of a solid-state pickup element according to a first embodiment of this invention.

Meanwhile, the relationship between the thickness of the transfer electrode and the sensitivity would become as shown in FIG. 9 as a result of actual measurement and simulation. In FIG. 9, the horizontal axis and the vertical axis stand for the thickness of the transfer electrode and the relative sensitivity, respectively. These values of the sensitivity is based on values obtained by integrating the spectral sensitivity calculated for each value of the thickness of the transfer electrode for each wavelength region.

According to the simulation result, the sensitivity indicates its peak value near the value 75 nm of the thickness of the transfer electrode, and the light transparency rate does not improve any more even if the thickness of the transfer electrode reduces less than that value. The peak appears again near 160 nm of the thickness, but its value is less than that appears near 75 nm of the thickness. Then, when the value measured by use of the actually manufactured solid-state image pickup device is referred to the simulation result, it can be confirmed that they are identical, which means that the simulation result stands for the real sensitivity characteristics. In consequence, it is understood that the thickness of the transfer electrode would be optimum at a range of 50 nm–100 nm, preferably in the range of ±10% approximately for the thickness of 75 nm where the sensitivity indicates its peak, since more than 90% of peak value of sensitivity can be kept at this region. This optimum value is almost identical to the optimum value of the thickness of the transfer electrode obtained from the simulation result shown in FIG. 8. In the solid-state image pickup device shown in FIG. 6, the thickness of the transfer electrodes 15 and 16 is set to 75 nm, adopting the conditions at the time of peak sensitivity.

In this manner, after the determination of the thickness of the transfer electrode so that the spectral sensitivity indicates its peak at a desired wavelength, the thickness of the oxide layer located under the transfer electrode is optimized.

Figure 10:
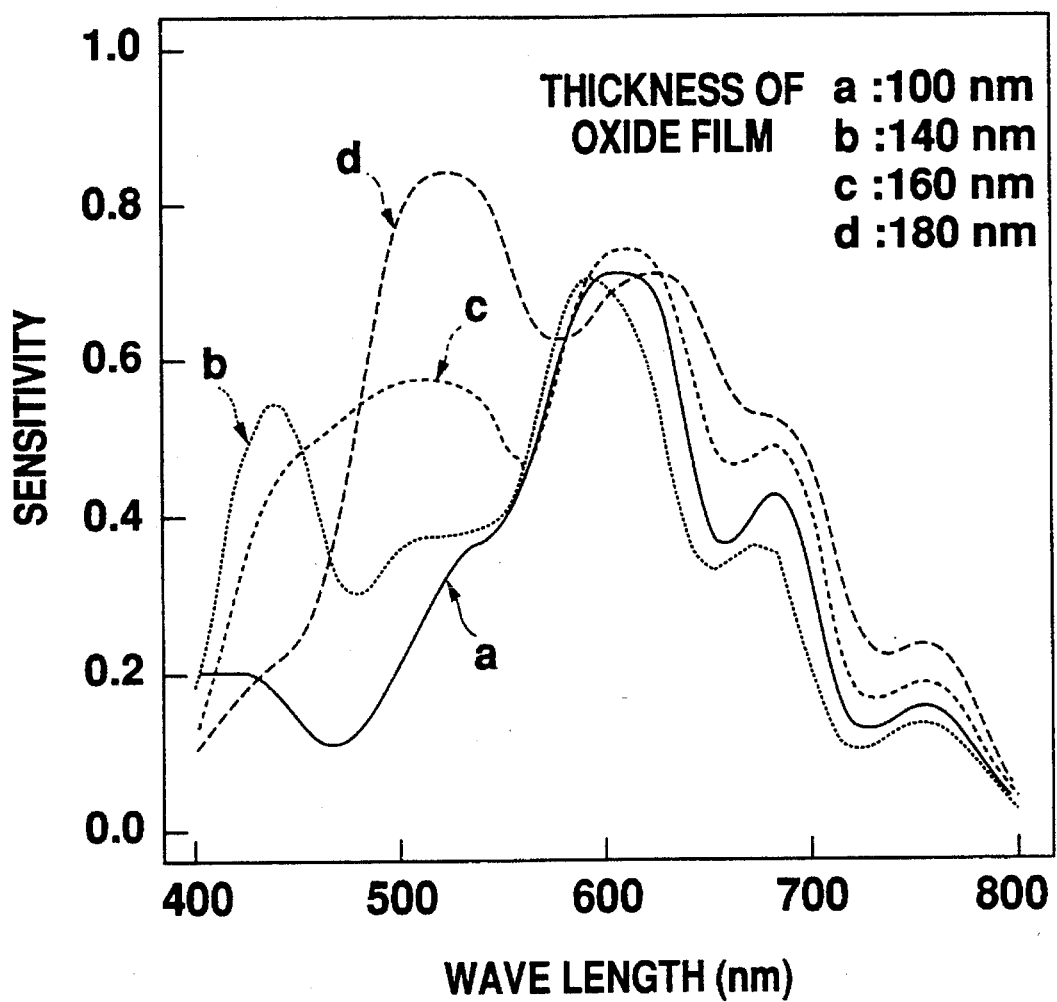
FIG. 10 is a graphic diagram showing a simulation result of a spectral sensitivity of a solid-state pickup element according to a first embodiment of this invention.

When the thickness of the transfer electrode is set to a predetermined value (75 nm), the thickness of the oxide layer located under the transfer electrode is set as a: 100 nm; b: 140 nm; c: 160 nm; and d: 180 nm. Then the spectral sensitivity characteristics of the solid-state image pickup device in each case would become as shown in FIG. 10 by simulation. In FIG. 10, the horizontal and vertical axes stand for the light wavelength and the relative sensitivity of incidental light, respectively. Each spectral sensitivity characteristics shows the same tendency at a wavelength of the incidental light being equal to or more than 600 nm, while quite different tendency depending on the thickness of the oxide layer is shown at the range of wavelength 400 nm–600 nm. In general, for the light of wavelength of approximately 500 nm, namely for the light near blue color, a solid-state image pickup device having substrate made of silicon would tend to present lack of sensitivity, so that keeping the blue color sensitivity would become an important factor for setting thickness. Therefore, it can be understood that "b" and "c" having excellent sensitivity for incidental light of less than 500 nm of wavelength are ideal. In the solid-state image pickup device shown in FIG. 6, the conditions of the case "c" showing the best overall sensitivity for the light having a wavelength between 400 nm and 600 nm is adopted, and the thickness of the oxide layer 14 located under the transfer electrodes 15 and 16 is set to 160 nm.

Figure 11:
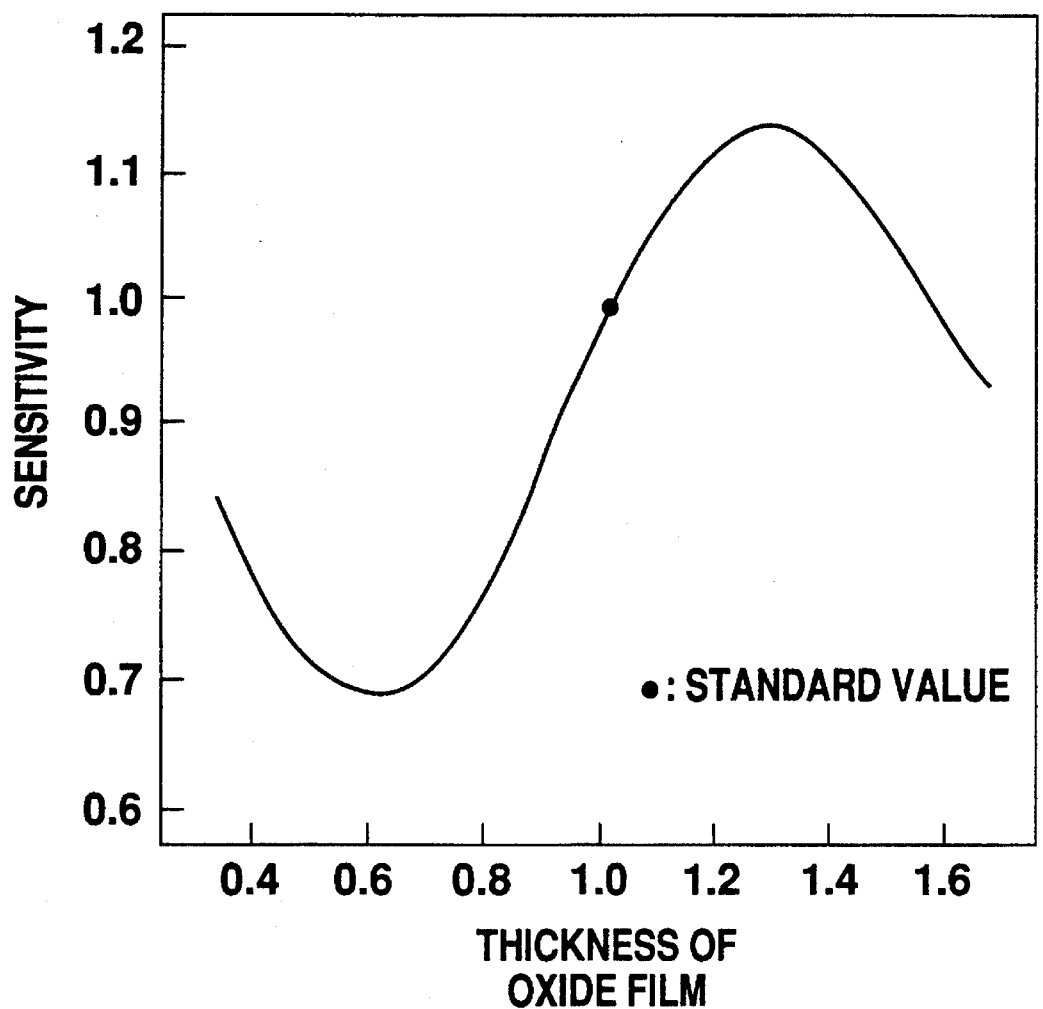
FIG. 11 is a graphic diagram showing a simulation result of relationship between the film thickness and sensitivity of transfer electrode of a solid-state pickup element according to a first embodiment of this invention.

On the other hand, the relationship between the thickness of the oxide layer under the transfer electrode and the sensitivity would be as shown in FIG. 11 according to the simulation result. In FIG. 11, the horizontal axis shows relative values of the thickness of the transfer electrode when the standard value is set to 150 nm, while the vertical axis stands for relative values of the sensitivity for all of the wave length regions. This sensitivity is based on the values having obtained by integrating the spectral sensitivity for all wavelength regions, so it cannot be judged as the value closest to the thickness at which the sensitivity indicates its peak value is the optimum value. However, it can be seen that the sensitivity more than the standard value is maintained at the range of 1.0–1.6 of the relative value. From these results, the value of the thickness of the oxide layer would become optimum at the range of 120 nm–180 nm, preferably in a range of ±10% approximately for 160 nm, when the thickness of the transfer electrode is 75 nm. The thickness of this oxide layer is the optimum value when the thickness of the transfer electrode is 75 nm, and varies depending on the thickness of the transfer electrode.

A method for manufacturing the transfer electrode and the oxide layer to have a desired thickness will be described. FIGS. 12A–12D are cross-sectional view showing each process of a method for manufacturing a solid-state image pickup device for the same portion as in FIG. 6.

Figure 12A:
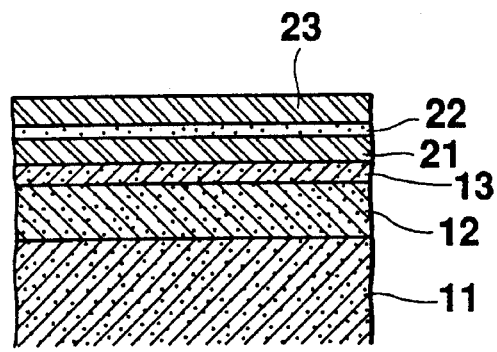
FIGS. 12A–12D are cross-sectional view showing each process of a method for manufacturing a solid-state pickup element according to a first embodiment of this invention.

(1) First Process (FIG. 12A)

Firstly, P-type impurities such as Boron ion are implanted into one surface of the N-type silicon substrate 11 to form a diffusion region 12, and a plurality of P-type region (not shown) of high density are formed as channel separating region in parallel to each other in the diffusion layer 11. At a channel region between the separating regions, a buried channel region 13 is formed by implanting N-type impurities such as phosphorus ion there into. These implantation processes are carried out using a resist mask formed in desired shape obtained by well-known photolithography technique. On the silicon substrate 11 having channel separating region and channel region therein, there is formed a silicon oxide layer 21 as a gate insulating layer to have a thickness of 160 nm by thermal oxidation. Further, by chemical vapor deposition, a polycrystal silicon layer 22 as transfer electrode and a silicon oxide layer 23 of interlayer insulating layer are formed to have thickness of 75 nm and 160 nm respectively. In this case, the thickness of the polycrystal silicon layer 22 and the silicon oxide layer 21 plays important role, so as to be formed to have accurate value of thickness by controlling the processing time and temperature etc.

Figure 12B:
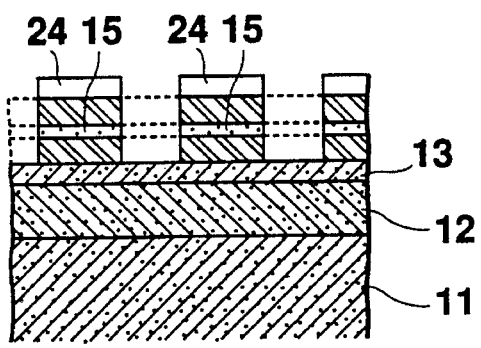

(2) Second Process (FIG. 12B)

Next, the resist mask 24 having been patterned into a predetermined shape is formed on the silicon oxide layer 23, and the polycrystalline silicon film 22 are etched in accordance with the resist mask 24 to form the transfer electrode 15 of the first layer. The first transfer electrode 15 extends in the direction crossing the channel region formed in the diffusion region 12 in parallel to each other with a predetermined space therebetween. Further, after removing the resist mask 24, the silicon oxide layer 21 is etched by reactive ion etching to expose the surface of the silicon substrate 11. At the time of this etching, the silicon oxide layer 23 remained on the first transfer electrode 15 functions as a protective layer for the first transfer electrode 15. In this manner, by exposing the surface of the silicon substrate 11 by removing the silicon oxide layer 21 after removing the resist mask 24, it is possible to prevent the impurities generated by removing the resist mask 24 from adhering to the surface of the silicon substrate 11.

Figure 12C:
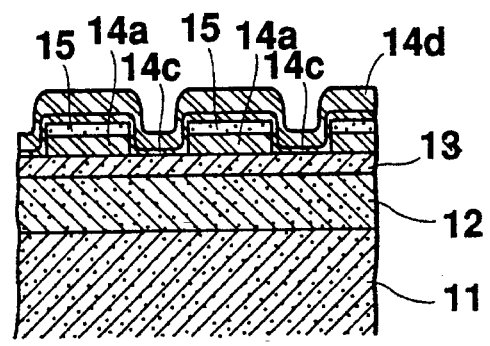

(3) Third Process (FIG. 12C)

The side surface of the first transfer electrode 15 and the surface of the silicon substrate 11 exposed between the first transfer electrodes 15 are subject to thermal oxidation with a thin thickness, and the silicon oxide layer 14c as a part of the gate insulating layer is formed to have a thickness of 10 nm. The thermal oxidizing process in this case should be preferably terminated in a short time for minimizing the change of the thickness of the first transfer electrode 15 and for preventing the thickness from being uneven due to the progress of the oxidation of the end portion of the silicon oxide layer 14a. Further, another silicon oxide layer 14d made by chemical vapor deposition is formed to have a thickness of 150 nm to cover the silicon oxide layer 14c. For forming the silicon oxide layer 14d, decompressing chemical vapor deposition using TEOS (Tetraethyl Orthosilicate), which is alcohol-like liquid at normal temperature, can be decomposed by heating, and deposit silicon oxide in accordance with the following reactive formula:

$$Si\ (OC_2H_5)_4 \rightarrow SiO_2 + 4C_2H_4 + 2H_2O$$

The silicon oxide depositing by use of this TEOS has an excellent difference in step coverage and suitable for interlayer insulating film.

Figure 12D:
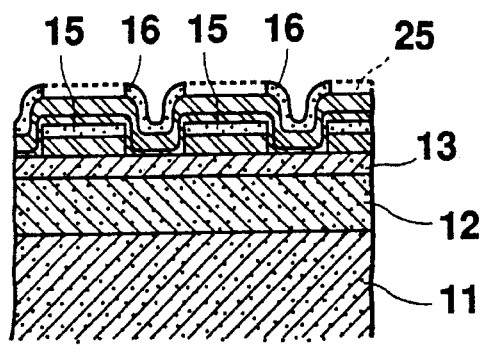

(4) Fourth Process (FIG. 12D)

After forming the silicon oxide layer 14d, a polycrystalline silicon layer 25 as transfer electrode is formed on the silicon oxide film 14d with a film thickness of 75 nm by chemical vapor deposition. The part of the polycrystalline silicon layer 25 overlapping the first transfer electrode 15 is removed by well-known etching process to form the transfer electrode 16 of the second layer covering between the transfer electrodes 15.

The second transfer electrodes 16, in the same manner as those of the first transfer electrodes 15, extend in the direction crossing the channel region ad are arranged to overlap the first transfer electrodes 15 having lateral sides accorded therewith. Between the second transfer electrodes 16 and the silicon substrate 11, there are provided silicon oxide layer 14c with a thickness of 10 nm and a silicon oxide layer 14d with a thickness of 150 nm are interposed, and its space from the silicon substrate 11 is set to 160 nm, the same value as in the case of the first transfer electrode 15.

Further, power supply lines made of aluminum etc. are formed to be coupled to the end portion of the transfer electrodes 15 and 16 to supply predetermined potential to the transfer electrodes 15 and 16 therethrough at the time of accumulating and transferring the information charges.

According to the aforementioned manufacturing processes, since the number of processes for thermal oxidation to be performed after the transfer electrodes 15 and 16 are formed is decreased, the thickness of the initially formed polycrystalline silicon layer 22 and 25 can be used directly as the thickness of the transfer electrodes 15 and 16, so that the thickness of the transfer electrodes 15 and 16 can be easily controlled. Further, the silicon oxide layer 14c in contact with the silicon substrate 11 under the second transfer electrodes 16 is formed by the same method (thermal oxidizing method) as that for forming the silicon oxide layer 14a being in contact with the silicon substrate 11 under the first transfer electrodes 15. Therefore, the interface state between the silicon and silicon oxide in each region become identical. As a result, the characteristics of the transfer electrodes 15 and 16 would be uniform so as to suppress the deterioration of the transfer efficiency.

In the aforementioned embodiment, a vertical overflow drain structure in which P-type diffusion region 12 is formed in the N-type silicon substrate has been described, but it is alternatively possible to use lateral over flow drain structure using P-type silicon substrate and having overflow drain in the separating region.

According to this invention, since the interference at the transfer electrodes and oxide layer thereunder is eliminated and the light can efficiently pass through the transfer electrodes to be incident on the channel region, a sufficient light-receiving sensitivity can be obtained even if the size of the light-receiving pixel is small. Further, sufficient sensitivity can be maintained even for light of short wavelength, so that an optimum spectral sensitivity characteristics can be provided to be suitable for color solid-state image pickup device.

Second Embodiment

A second embodiment will now be described. This embodiment is basically similar to the first embodiment, but the thickness of the transfer electrode and the oxide layer located thereunder is slightly changed therefrom.

Figure 13:
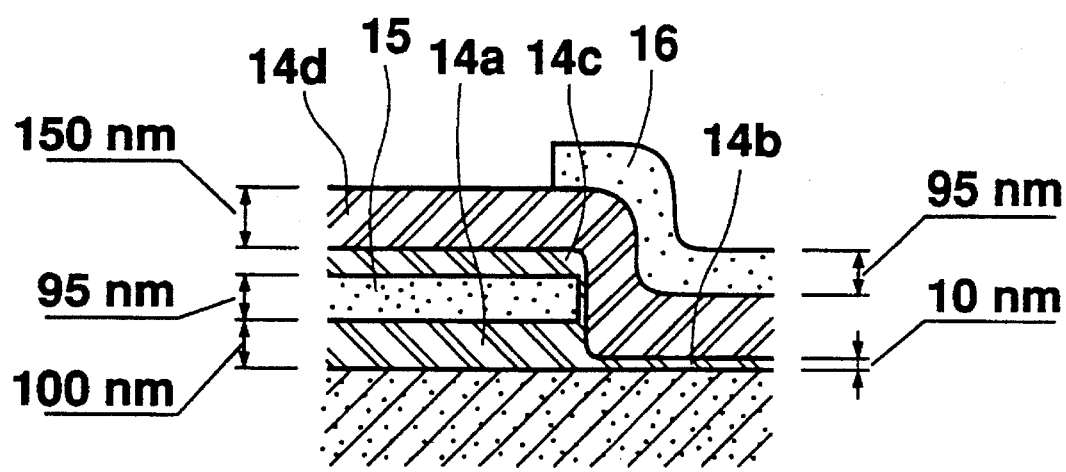
FIG. 13 is an enlarged view of a transfer electrode portion of a solid-store pickup element according to a second embodiment of this invention.

Namely, in the second embodiment, as shown in FIG. 13, the thickness of the silicon oxide layer 14a is set to approximately 100 nm, the thickness of the transfer electrode 15 is set to approximately 95 nm, the thickness of the silicon oxide layer 14d is set to approximately 150 nm, the thickness of the silicon oxide layer 14c is set to approximately 10 nm, the thickness of the transfer electrodes 16 is set to approximately 95 nm.

Figure 14:
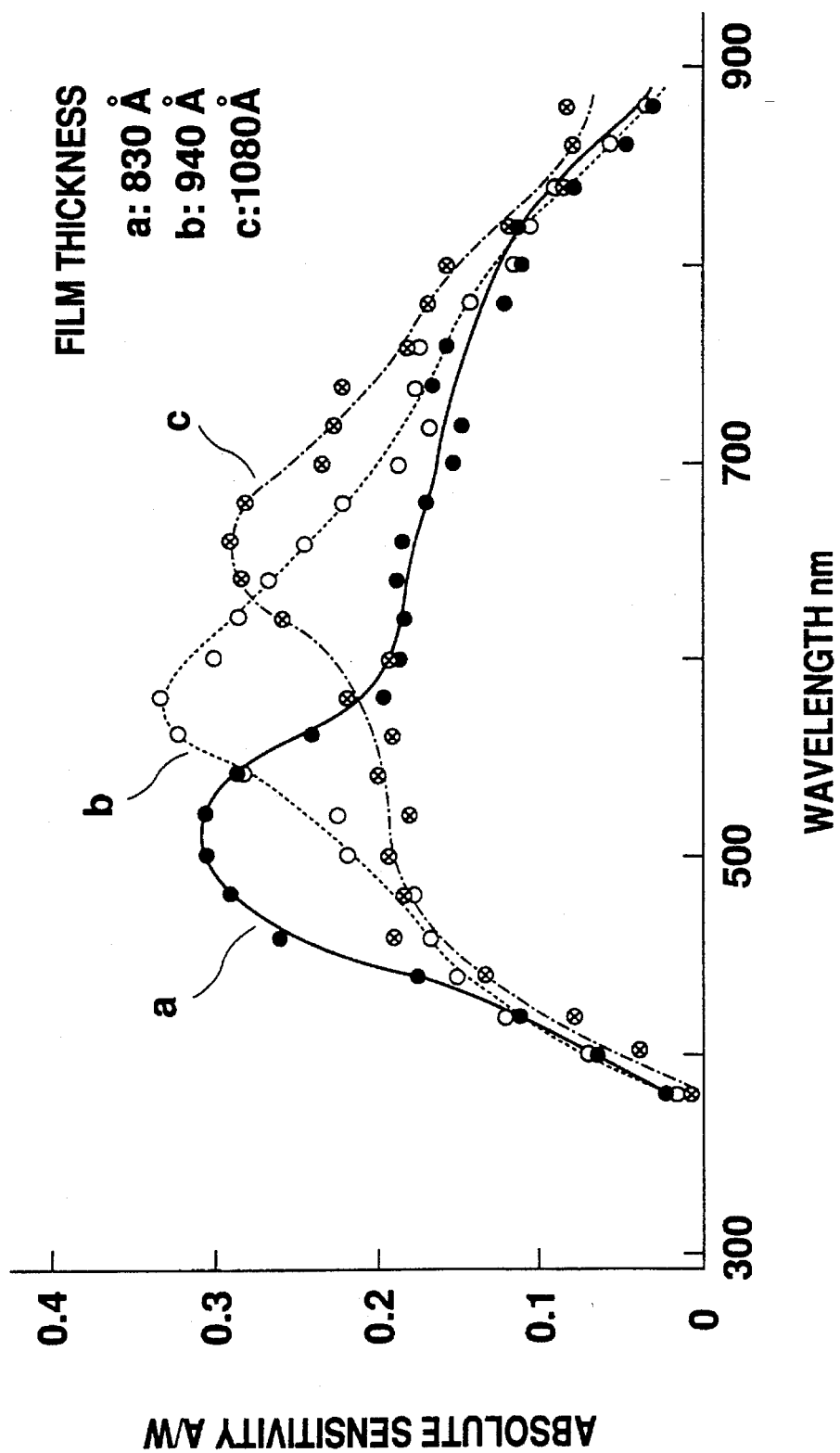
FIG. 14 is a graphic diagram showing measured values of spectral sensitivity of a solid-state pickup element according to a second embodiment of this invention.

The spectral sensitivity characteristics of the solid-state image pickup device is shown in FIG. 14. In FIG. 14, the horizontal and the vertical axes stand for the light wavelength and the absolute sensitivity representing how much of current can be obtained for incident light energy respectively. In FIG. 14, the codes "a", "b" and "c" represent cases of the thickness of the transfer electrode being 83 nm, 94 nm, and 108 nm (measured value) respectively.

The absolute sensitivity, in any case of a, b and c, rises at approximately 400 nm of the incidental light wavelength and fall off at approximately 900 nm. It is confirmed that the peak position of the absolute sensitivity tends to deviate toward the long wavelength side as the thickness of the transfer electrode increases. In this case, in regard to the absolute sensitivity of the visible light region (approximately 400 nm–700 nm of wavelength), the "b" having a peak at approximately intermediate portion of the visible light region has the characteristics closest to the ideal one. Namely, if the peak of the absolute value lies at the intermediate position of the visible region, the absolute sensitivity would be equal for both the short wavelength side and long wavelength side, so as to provide well-balanced spectral sensitivity characteristics.

Figure 15:
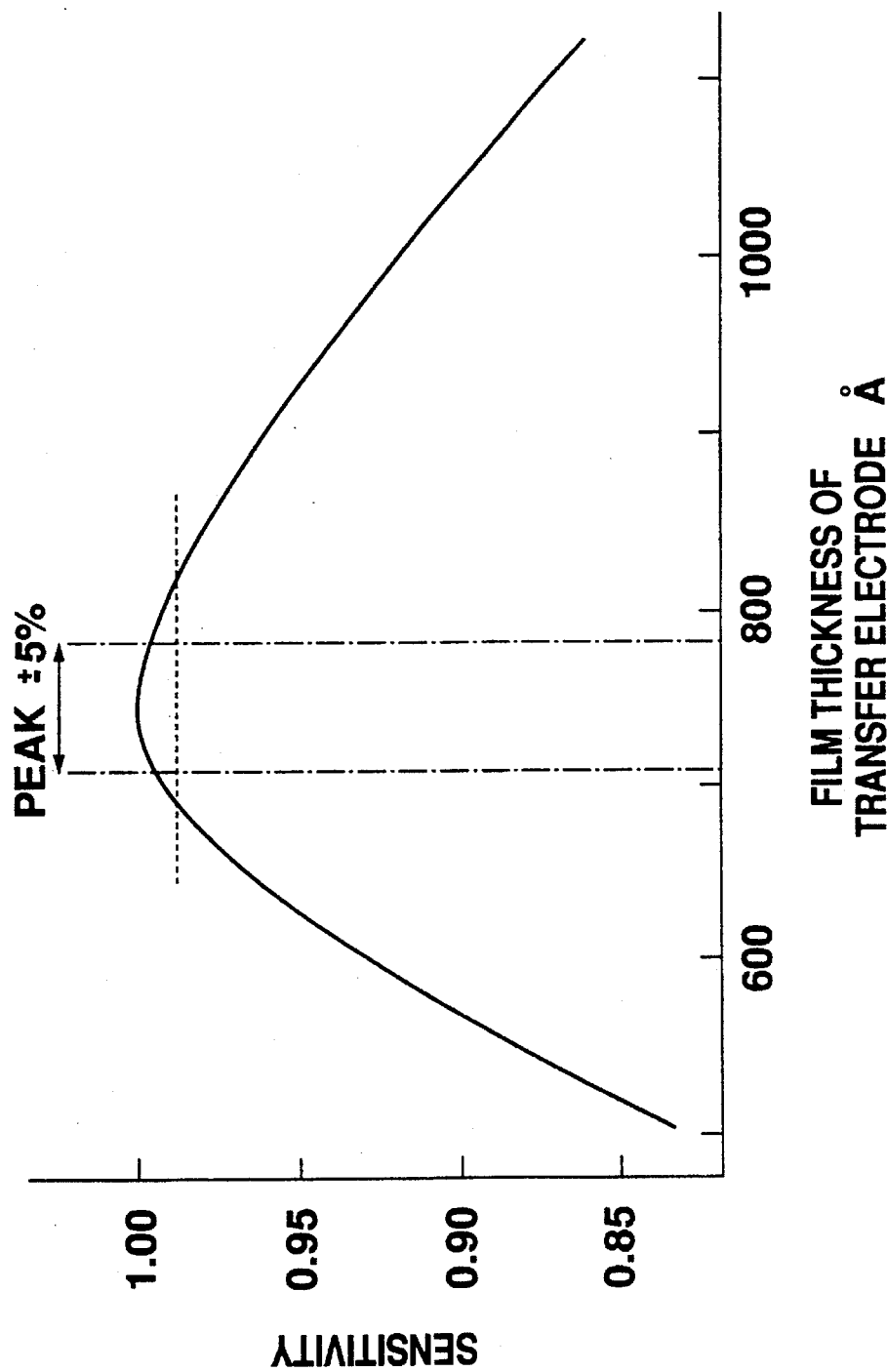
FIG. 15 is a graphic diagram showing simulation result of relationship between film thickness and sensitivity of transfer electrode of a solid-state pickup element according to a second embodiment of this invention.

The relationship between the thickness of the transfer electrode and the sensitivity obtained by simulation is shown in FIG. 15. In FIG. 15, the horizontal and the vertical axes stand for the thickness of the transfer electrode and the relative value of the sensitivity with the peak value 1 respectively. This sensitivity is based on the value obtained by integrating the spectral sensitivity calculated for each value of the thickness of the transfer electrode over all wavelength regions.

According to the result of the simulation, the peak appears at a range between 74 nm–75 nm of the thickness of the transfer electrode, and it is understood that the light incident efficiency is not enhanced any more even the transfer electrode becomes thinner than those values, possibly due to the influence of the light interference. Incidentally, if the thickness of the transfer electrode is made more thinner, the peak of the sensitivity would arise again. But this thickness is not sufficient for keeping the reliable function of the transfer electrode so as to be impractical to be used for actual solid-state image pickup device. As a consequence, when a range of ±5% for the peak value is selected, the relative value of the sensitivity would be equal to or more than 99% (shown by dotted line in FIG. 15), so that the thickness of the transfer electrode would be sufficiently available if it is approximately ±5% for the optimum value. Accordingly, from the measured value shown in FIG. 14 and the simulation result shown in FIG. 15, it is judged that the ideal thickness of the transfer electrode would be approximately ±5% for 94 nm of thickness, namely in the range of approximately 90 nm–100 nm. The deviation of the simulation result from the measured value may be due to the fact that the quantum efficiency can not be specified in the silicon substrate 11 and that the actual solid-state image pickup device has two-layered transfer electrode having partially overlapped portion.

Third Embodiment

Figure 16:
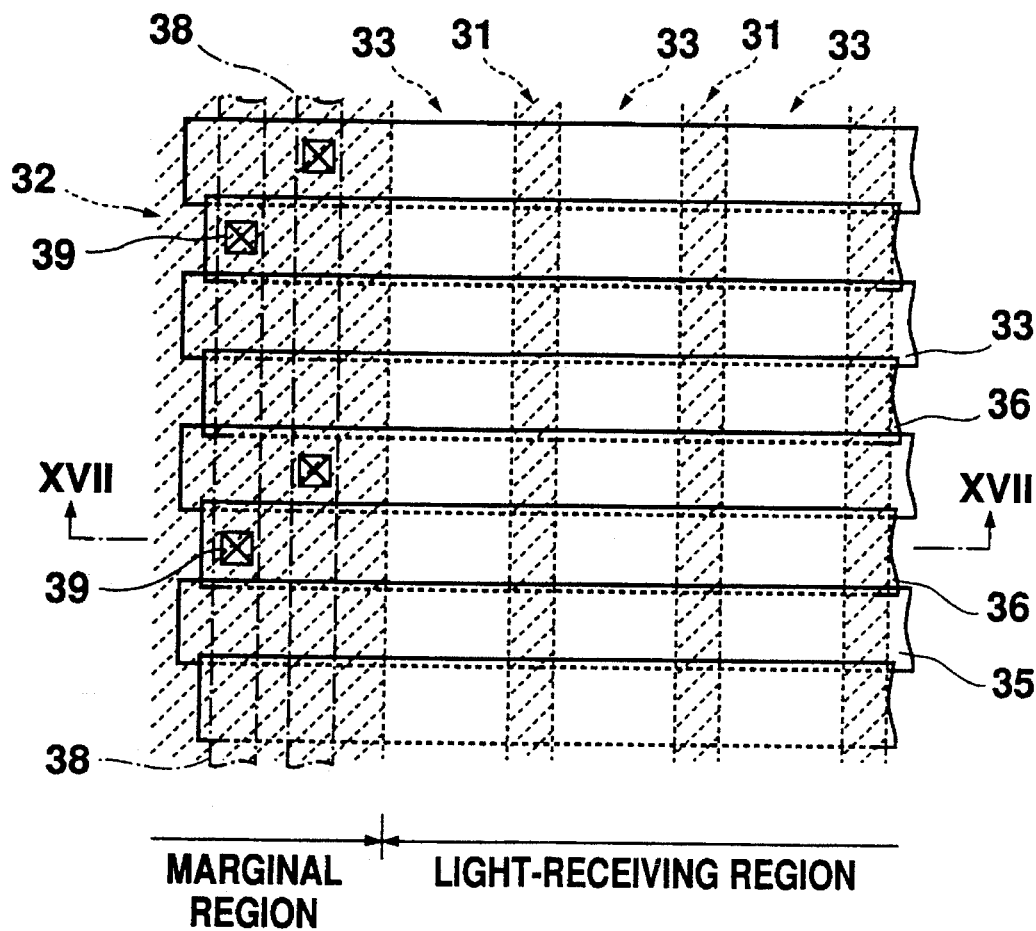
FIG. 16 is a plan view showing pickup section of a solid-state pickup element according to a third embodiment of this invention.
Figure 17:
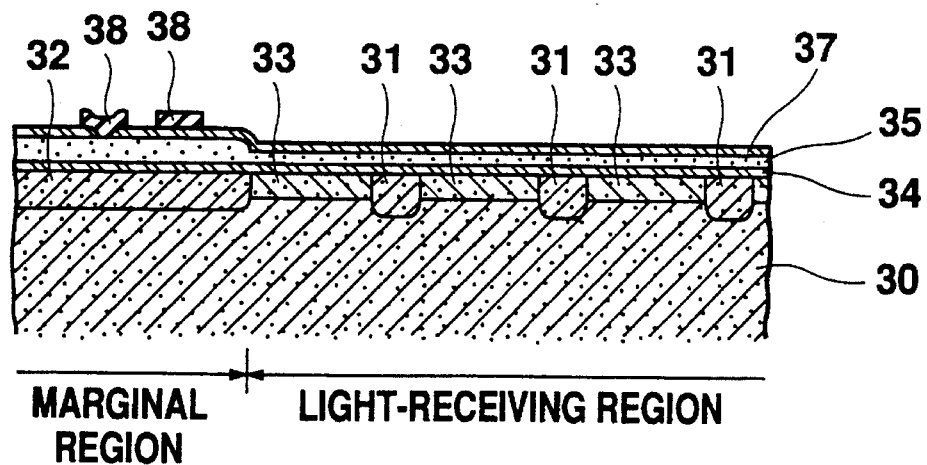
FIG. 17 is a cross-sectional view via XVII—XVII line in FIG. 16.

FIG. 16 is a plan view showing a structure of the pickup section of the solid-state image pickup device according to this invention, while FIG. 17 is a cross-sectional view via the XVII—XVII line in FIG. 16.

At the light-receiving region at one surface of the P-type silicon substrate 30, a plurality of channel separating regions 31 containing P-type impurities implanted therein with a high density are arranged in parallel to each other. In the same manner, separating regions 32 containing P-type impurities in high density are formed at the marginal region to surround the light-receiving region. The channel region between the channel separating regions 31 form a buried channel structure with the N-type impurities being diffused at the surface portion of the substrate. A plurality of first transfer electrodes 35 made of polycrystalline silicon are formed on the silicon substrate 30 having the separating region 31 and the channel region 33 thereon to extend until the marginal region crossing the light-receiving region in the direction crossing the channel region 33 via the insulating layer 34. A plurality of second transfer electrodes 36 made of also polycrystalline silicon are formed on the transfer electrodes 35 to cover the space between the first transfer electrodes 35 to form two-layered structure. The transfer electrodes 35 and 36 are formed to have its thickness thinner at the light-receiving region than its marginal region, so that the light would easily pass through the transfer electrode 35 and 36 at the light-receiving region. Power supply lines 38 made of aluminum are mounted via an insulating layer 37 on the transfer electrodes 35 and 36 at the marginal region to be coupled to the transfer electrodes 35 and 36 through a contact hole 39 formed in the insulating layer 38. The power supply lines 38 are provided to correspond to the number of phases of the transfer clocks to be supplied to the transfer electrodes 35 and 36. In the case of four-phase clock, four wires 38 are provided, each fourth wire is coupled to the transfer electrodes 35 and 36. Since the transfer electrodes 35 and 36 have the thickness thicker at the portion of connection with the power supply lines 38, piercing by contact would not easily take place.

FIGS. 18A–18D are cross-sectional view for each process showing a method for manufacturing a solid-state image pickup device according to this invention.

Figure 18A:
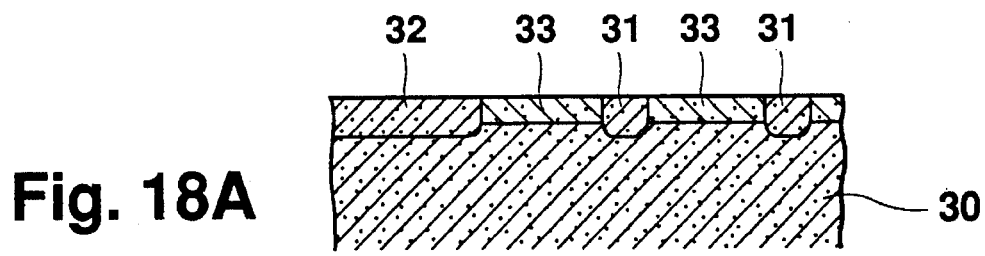
FIGS. 18A–18D are cross-sectional view showing each process of a method for manufacturing solid-state pickup element according to a third embodiment of this invention.

(1) First Process (FIG. 18A)

P-type impurities such as boron is implanted into one surface of the N-type silicon substrate 30 with high density to form the channel separating regions 31 and 32, and then N-type impurities such as phosphorus is implanted between the channel separating regions 31 to form channel region 33 having buried channel structure. These implatation processes are carried out using a resist pattern of a desired shape obtained by well-known photolithographic technique as a mask.

Figure 18B:
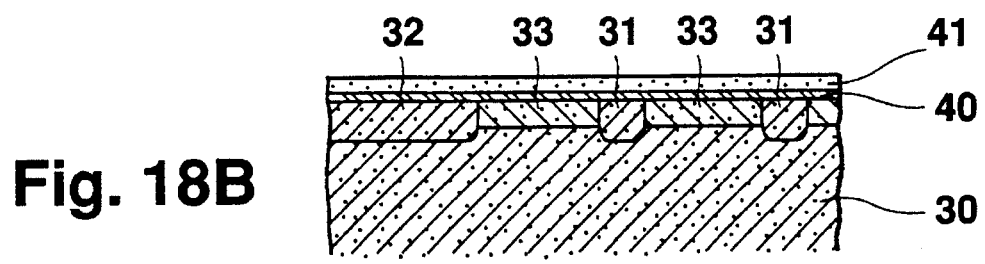

(2) Second Process (FIG. 18B)

On the silicon substrate 30 having the separating regions 31 and 32 and the channel region 33 thereon, an oxide layer 40 is formed for example by thermal oxidation to have a thickness of 100 nm to become a gate insulating layer 34, and a polycrystalline silicon layer 41 to become a transfer electrode 35 is formed by chemical vapor deposition on the oxide layer 40 to have a thickness of 100 nm.

Figure 18C:
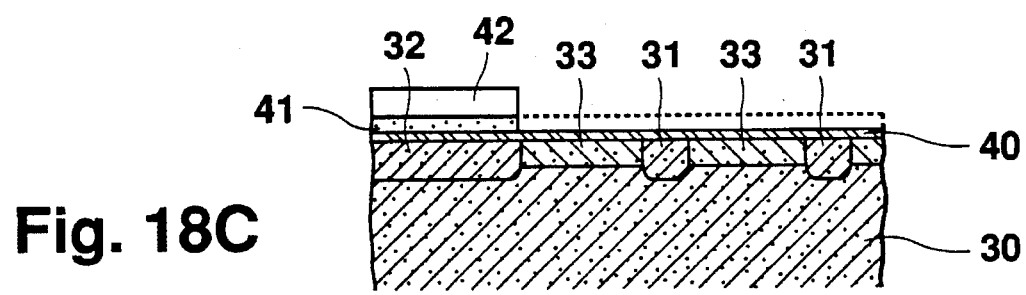

(3) Third Process (FIG. 18C)

The resist pattern 42 having the light-receiving region being opened is formed on the polycrystalline silicon layer 41, and the polycrystalline silicon layer 41 is etched with the resist pattern 42 as a mask to be removed, so that a polycrystalline silicon layer 41 is remained only at the marginal region.

Figure 18D:
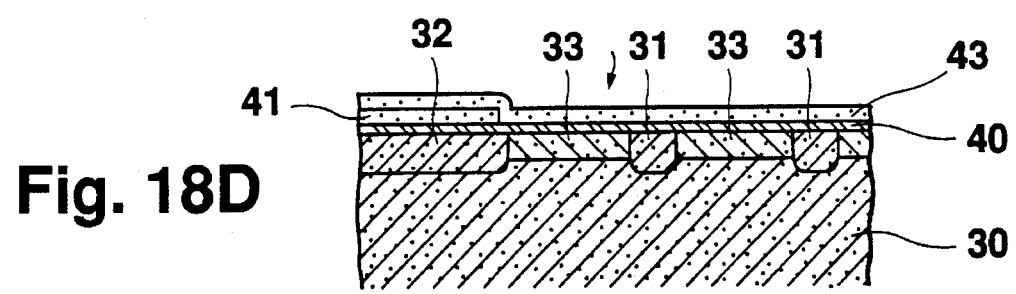

(4) Fourth Process (FIG. 18D)

Thereafter, the polycrystalline silicon layer is formed to have a thickness of 300 nm by chemical vapor deposition again, so as to provide a polycrystalline silicon layer 43 having a thickness being thinner at the light-receiving region and thicker at the marginal region. Thereafter, first transfer electrodes 35 crossing the light-receiving region in the direction crossing the channel separating region 31 are formed by patterning the polycrystalline silicon layer 43.

After forming the interlayer insulating layer by thermally oxidizing the surface portion of the first transfer electrode 35, in the same manner, the process for forming the polycrystalline silicon layer is repeated to provide a polycrystalline silicon layer having a thickness thicker at the marginal region than at the light-receiving region. By patterning the polycrystalline silicon layer, second transfer electrodes 36 covering the space between the first transfer electrodes 35 are formed. The processes for forming the second transfer electrodes 36 are also as shown in FIGS. 18B–18D. After forming the transfer electrodes 35 and 36, power supply lines 38 are formed at the marginal region via insulating layer 37 such as nitride layer. The power supply lines 38 are formed by etching the aluminum layer formed by spattering etc. into a desired pattern after forming the contact hole 39 at a predetermined position of the insulating layer 37.

According to the manufacturing processes mentioned above, both the transfer electrodes 35, 36 of the first and the second layers have thickness thicker at its light-receiving region and thinner at its marginal region, so that the light projection onto the channel region is kept at the light-receiving region, while piercing due to the contact with the power supply lines 38 can be avoided at the marginal region.

The transfer electrodes at the accumulating section and the horizontal transfer section except the image pickup section are, different from the polycrystalline silicon layer 41 at the light-receiving region, not removed and are composed of polycrystalline silicon layer 41 and 43 being formed twice to have the same thickness as that of the transfer electrodes 35 and 36 at the marginal region. Further, the gates of the transistor at the output section are formed by the same processes as those for the transfer electrodes in the horizontal transfer section, and have the same thickness as that of the transfer electrodes 35 and 36 at the marginal region.

Fourth Embodiment

FIGS. 19A–19D are cross-sectional view showing each process of a method for manufacturing a solid-state image pickup device according to this invention.

Figure 19A:
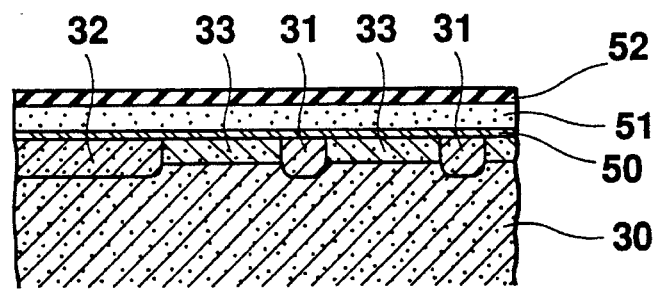
FIGS. 19A–19D are cross-sectional view showing each process of a method for manufacturing solid-state pickup element according to a fourth embodiment of this invention.

(1) First Process (FIG. 19A)

The channel separating regions 31 are formed by implanting P-type impurities such as boron of high density into the light-receiving region of the P-type silicon substrate 30. In the same manner, P-type impurities are implanted also into the marginal region to form the separating region 32. Further, N-type impurities such as phosphorus are implanted between the channel separating region 31 to form channel regions 33 having buried channel structure. These implantation processes are carried out using a resist pattern of a desired shape obtained by well-known photolithographic technique as a mask.

After forming an oxide layer 50 to become a gate insulating layer by thermal oxidation on the silicon substrate 30 having the channel separating regions 31 and 32 and the channel regions 33 formed thereon, a polycrystalline silicon layer 51 to become transfer electrodes by chemical vapor deposition and nitride layer 52 to become a mask for selective oxidation are sequentially formed.

Figure 19B:
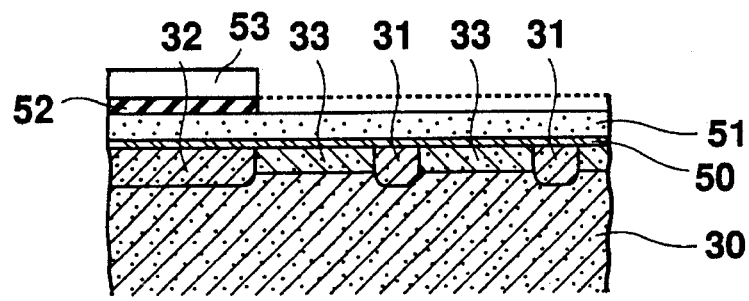

(2) Second Process (FIG. 19B)

A resist pattern 53 having the light-receiving region being opened is formed on the nitride layer 52, which is then etched with the resist pattern 53 as a mask. As a result, the nitride layer 52 will be remained as an anti-oxidation mask at the portion except the light-receiving region.

Figure 19C:
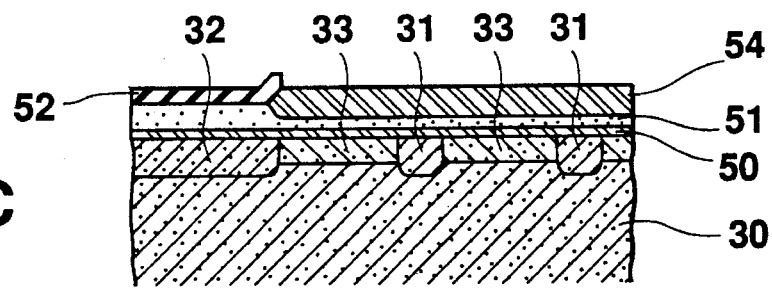

(3) Third Process (FIG. 19C)

A thick oxide layer 54 is formed at the light-receiving region by selectively oxidizing the polycrystalline silicon layer 51. In this selective oxidizing process, the processing conditions are set by leaving the polycrystalline silicon layer 51 to have a predetermined thickness so that the oxide layer does not reach the insulating layer 50 located under the polycrystalline silicon layer 51.

Figure 19D:
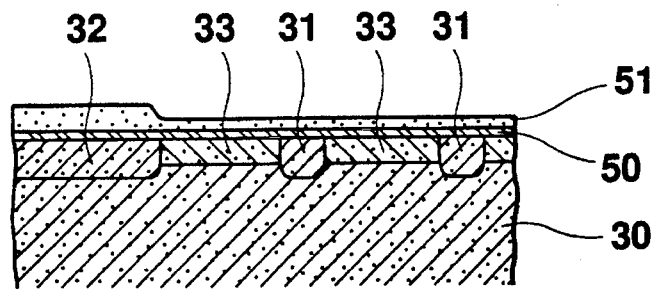

(4) Fourth Process (FIG. 19D)

A polycrystalline silicon layer 51 having thin thickness at the light-receiving region and thick thickness at the marginal region can be obtained by removing the nitride layer 52 and the oxide layer 54. Then there are formed first transfer electrodes crossing the light-receiving region in the direction crossing the channel regions 33 and extending until the marginal region by patterning the polycrystalline silicon layer 35.

Further, after forming an interlayer insulating layer by thermal oxidation of the surface portion of the first transfer electrodes, the processes for forming the polycrystalline silicon layer are repeated so as to form a polycrystalline silicon layer having a marginal region with a thickness thicker than that in the light-receiving region. By patterning this polycrystalline silicon layer, the second transfer electrodes covering the space between the first transfer electrodes are formed. After forming the second transfer electrodes in this manner, power supply lines are formed at the marginal region via an insulating layer such as nitride layer to be coupled to the transfer electrodes.

Accordingly, it is possible to provide transfer electrodes of two-layered structure having thin thickness at the light-receiving region and thick thickness at the marginal region. As a result, a solid-state image pickup device having a shape identical to that shown in FIG. 17 can be obtained.

According to the aforementioned processes, transfer electrode having different thickness at the light-receiving region from that at the marginal region can be obtained by just one process of forming the polycrystalline silicon layer, and further the gate insulating layer under the polycrystalline silicon layer would not be undesirably etched.

According to this invention, transfer electrodes having thinner thickness at the light-receiving region of the pickup section can be obtained by just one process of forming the polycrystalline silicon layer. As a result, the processing time required to form the polycrystalline silicon layer can be shortened. In addition, since the insulating layer under the polycrystalline silicon layer would not be undesirably etched at the time of reducing the thickness of the polycrystalline silicon layer at the light-receiving region, the insulating layer can be maintained to have a predetermined thickness so as to prevent the device from lowering in reliability.

In the aforementioned embodiments, a case using P-type silicon substrate has been described. It is also possible, however, to use N-type silicon substrate with a so-called longitudinal overflow drain structure forming P-type diffusion region.

According to the present invention, the thickness of the transfer electrode is reduced at the light-receiving region of the image pickup section to improve the light incidental efficiency, while piercing at the contact portion between the transfer electrode and the power supply lines is prevented, so as to enhance the reliability of the device. Moreover, since the transfer electrode at the portion other than the image pickup section and the gate electrode formed at the marginal portion can be composed to have a desired thickness, so that the lowering of the transfer efficiency at the side of receiving the information charges from the imaging section can be suppressed and the characteristics of the circuit formed at the image pickup section can be prevented from deteriorating.

What is claimed is:

1. A solid-state image pickup device for accumulating information charges, generated in response to light incident on a semiconductor substrate, in a potential well formed in a portion adjacent to a surface of the substrate by function of a plurality of transfer electrodes arranged on the substrate, said device manufactured by the steps of:

forming an insulating layer on the semiconductor substrate on which a plurality of channel separating regions are formed in parallel to each other for preventing the information charges from moving;

forming a plurality of first transfer electrodes extending in the direction crossing said channel separating regions in parallel to each other with a predetermined space therebetween, said first transfer electrodes having a thickness in the range of approximately 50 nm–100 nm;

forming a first insulating layer of a material by slightly oxidizing the surface of said first transfer electrodes and the exposed surface of said semiconductor substrate;

forming a second insulating layer by chemical vapor deposition of the same material as said first insulating layer on said first insulating layer; and forming a plurality of second transfer electrodes to cover the space between said first transfer electrodes on said second insulating layer, said second transfer electrodes having a thickness in the range of approximately 50 nm–100 nm.

2. A solid-state image pickup device according to claim 1, wherein:

said first and second transfer electrodes are made of polycrystalline silicon; and said first and second insulating layers are made of silicon oxide.

3. A solid-state image pickup device for accumulating information charges, generated in response to light incident on a semiconductor substrate, in a potential well formed in a portion adjacent to a surface of the substrate by function of a plurality of transfer electrodes arranged on the semiconductor substrate, said device comprising:

a semiconductor substrate having a plurality of channel separating regions formed at least in an inner region of the substrate and being arranged in parallel to each other for preventing the information charges from moving;

a plurality of transfer electrodes arranged in parallel to each other with a predetermined space therebetween on the semiconductor substrate, and extending in the direction crossing said channel separating region until a marginal region surrounding said inner region;

a plurality of power supply lines arranged to overlap the end portions of said transfer electrodes at said marginal region to be regularly connected to each of the transfer electrodes;

wherein said transfer electrodes have a thickness larger at said marginal region than at said inner region.

4. A solid-state image pickup device according to claim 3, wherein said transfer electrode comprises:

a plurality of first transfer electrodes arranged in parallel to each other on said semiconductor substrate with a predetermined space therebetween and extending in the direction crossing said channel separating regions; and a plurality of second transfer electrodes arranged to cover the space between said first transfer electrodes;

wherein the first and the second transfer electrodes are mutually insulated.

5. A solid-state image pickup device for accumulating information charges, generated in response to light incident on a semiconductor substrate, in a potential well formed in a portion adjacent to a surface of the substrate by function of a plurality of transfer electrodes arranged on the semiconductor substrate, said device manufactured by the steps of:

forming a plurality of channel separating regions in parallel to each other at an inner region on the surface of the semiconductor substrate for preventing the information charges from moving;

forming a first insulating layer on said semiconductor substrate;

forming a first conductive layer at an inner region on said semiconductor substrate and at a marginal region surrounding said inner region;

eliminating a part of said first conductive layer corresponding to said inner region;

forming a second conductive layer at said inner region and at said marginal region;

forming a plurality of first transfer electrodes extending until said marginal region after crossing said inner region, by patterning said first and second conductive layers in the direction crossing said channel separating region, said first transfer electrodes having a thickness Larger at said marginal region than at said inner region; and forming power supply lines to be coupled to said first transfer electrodes at said marginal region.

6. A solid-state image pickup device according to claim 5, wherein said steps of manufacturing further include:

forming an insulating layer on the semiconductor substrate between said first transfer electrodes after forming said first transfer electrodes; and forming second transfer electrodes on a region of the insulating layer being formed between said first transfer electrodes.

7. A solid-state image pickup device for accumulating information charges, generated in response to light incident on a semiconductor substrate, in a potential well formed in a portion adjacent to a surface of the semiconductor substrate by function of a plurality of transfer electrodes arranged on the semiconductor substrate, said device manufactured by the steps of:

forming a plurality of channel separating regions in parallel to each other at an inner region on the surface of the semiconductor substrate for preventing the information charges from moving;

forming a first insulating layer on said semiconductor substrate;

forming a conductive layer at an inner region and at a marginal region surrounding said inner region on said semiconductor substrate;

selectively oxidizing the surface of said conductive layer in a range corresponding to said inner region;

forming a plurality of first transfer electrodes crossing said inner region and extending until said marginal region by patterning said conductive layer after removing the oxidized portion of said conductive layer, said first transfer electrodes having a thickness larger at said marginal region that at said inner region; and forming power supply lines connected to the transfer electrodes at said marginal region.

8. A solid-state image pickup device according to claim 7, wherein said steps of manufacturing further include:

forming an insulating layer at a region on the semiconductor substrate between said first transfer electrodes after forming said first transfer electrodes; and forming a plurality of second transfer electrodes at a portion on the insulating layer being formed between said first transfer electrodes.

* * * * *